US012733107B2

(12) United States Patent
Ecton et al.

(10) Patent No.: US 12,733,107 B2
(45) Date of Patent: Sep. 8, 2026

(54) ENHANCED SUBTRACTIVE ETCH ANISOTROPY USING ETCH RATE GRADIENT

(71) Applicant: Intel Corporation, Santa Clara, CA (US)

(72) Inventors: Jeremy Ecton, Gilbert, AZ (US); Robert Alan May, Chandler, AZ (US); Suddhasattwa Nad, Chandler, AZ (US); Srinivas V. Pietambaram, Chandler, AZ (US); Brandon C. Marin, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 62 days.

(21) Appl. No.: 17/937,894

(22) Filed: Oct. 4, 2022

(65) Prior Publication Data

US 2024/0114627 A1 Apr. 4, 2024

(51) Int. Cl.
*H05K 3/06* (2006.01)
*H05K 1/09* (2006.01)
(Continued)

(52) U.S. Cl.
CPC ............... *H05K 3/062* (2013.01); *H05K 1/09* (2013.01); *H05K 3/067* (2013.01); *H10W 70/05* (2026.01);
(Continued)

(58) Field of Classification Search
CPC .......... H05K 3/062; H05K 1/09; H05K 3/067; H05K 1/181; H05K 2201/0338;
(Continued)

(56) References Cited

U.S. PATENT DOCUMENTS

2004/0245213 A1* 12/2004 Fukase .................. G03F 7/0035 216/13
2006/0207888 A1* 9/2006 Taylor ...................... C25F 3/02 205/646

(Continued)

OTHER PUBLICATIONS

Meuleman, W.R.A. et al "Effect of Current and Potential Waveforms on Sublayer Thickness of Electrodeposited Copper-Nickel Multilayers", Journal of the Electrochemical Society, 149 (10) C479-C486 (2002).

(Continued)

*Primary Examiner* — Mark W Tornow
(74) *Attorney, Agent, or Firm* — Akona IP PC

(57) ABSTRACT

Embodiments provides for a package substrate, including: a core comprising insulative material; first conductive traces in contact with a surface of the core; and buildup layers in contact with the first conductive traces and the surface of the core, the buildup layers comprising second conductive traces in an organic dielectric material. The first conductive traces comprise at least a first metal and a second metal, the first conductive traces comprise a first region proximate to and in contact with the core and a second region distant from the core, parallel and opposite to the first region, a relative concentration of the first metal to the second metal is higher in the first region than in the second region, and the relative concentration of the first metal to the second metal between the first region and the second region varies non-uniformly.

20 Claims, 7 Drawing Sheets

(51) Int. Cl.

| | |
|---|---|
| ***H05K 1/181*** | (2026.01) |
| ***H10W 70/05*** | (2026.01) |
| ***H10W 70/652*** | (2026.01) |
| ***H10W 70/66*** | (2026.01) |

(52) U.S. Cl.
CPC ......... *H10W 70/652* (2026.01); *H10W 70/66* (2026.01); *H05K 1/181* (2013.01); *H05K 2201/0338* (2013.01); *H05K 2203/0789* (2013.01); *H05K 2203/0793* (2013.01)

(58) Field of Classification Search
CPC ... H05K 2203/0789; H05K 2203/0793; H05K 3/064; H05K 3/4605; H10W 70/05; H10W 70/652; H10W 70/66; H10W 90/00; H10W 70/635; H10W 70/095; H10W 70/65; H10W 70/685; H10W 70/69
See application file for complete search history.

(56) References Cited

U.S. PATENT DOCUMENTS

| | | | | |
|---|---|---|---|---|
| 2019/0214272 | A1* | 7/2019 | Ecton | H10P 50/667 |
| 2020/0258800 | A1* | 8/2020 | Ecton | H05K 3/062 |
| 2021/0313503 | A1* | 10/2021 | Patel | H10N 10/17 |

OTHER PUBLICATIONS

Suh, Hoyoung et al "Electroplating of Copper-Nickel Thin Films and Narrow Trenches", Electrochemical and Solid-State Letters, 14 (12) H483-H486 (2011).

* cited by examiner 400
404
406
402
102
206
$RC_2$
204
208
$RC_1$
106
104

ENHANCED SUBTRACTIVE ETCH ANISOTROPY USING ETCH RATE GRADIENT

TECHNICAL FIELD

The present disclosure relates to techniques, methods, and apparatus directed to enhanced subtractive etch anisotropy using etch rate gradient.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
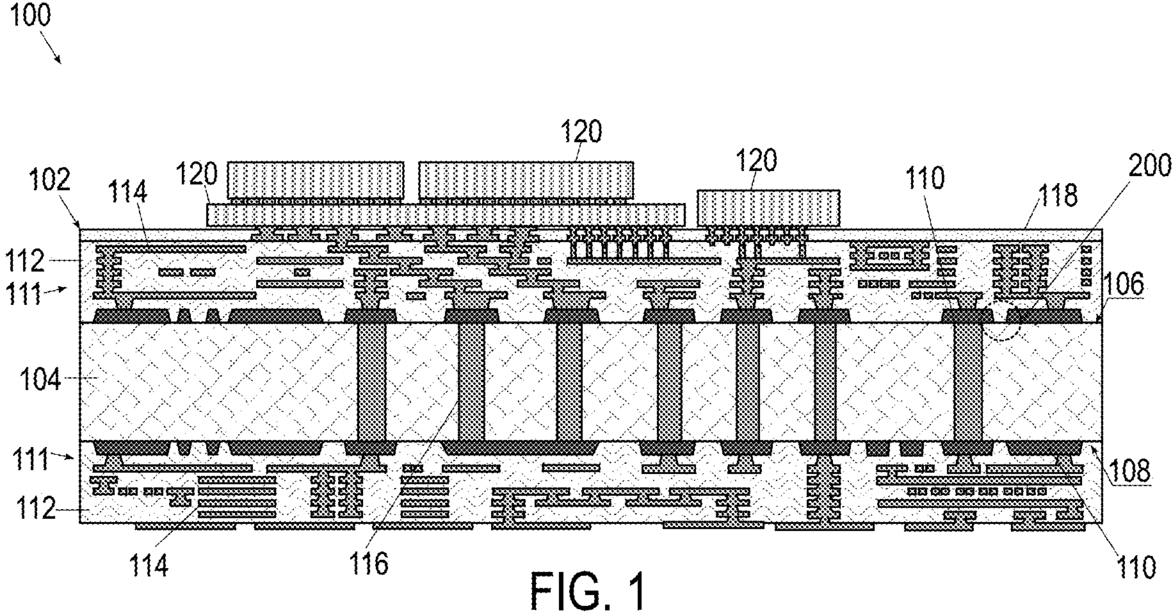
FIG. 1 is a schematic cross-sectional view of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be property explained. Such information is offered for purposes of explanation only and, accordingly, should not be construed in any way to limit the broad scope of the present disclosure and its potential applications.

For the past several decades, scaling down of features in ICs has been a driving force for facilitating increased functionalities in ICs. Scaling to smaller features enables increased densities of functional units on the limited real estate of semiconductor chips. Associated with scaling down of features is the need to improve dimensional tolerances and resolution to enable high density interconnects. Such scaling needs apply alike at the IC level, and at the package substrate level. However, in package substrate manufacturing in particular, core patterning process is approaching a fundamental limit in line/space resolution capability based on conventional technologies. Novel technologies are needed to break through these technological barriers and enable substrate manufacturing that can support upcoming technology nodes.

A typical package substrate manufacturing process starts with a copper clad laminate core, consisting of a laminate material with thin copper foil on both sides. Vias are drilled into the core as needed to form through-holes. The core with the vias is first coated with a thin layer of copper using an electroless plating process so that a conducting path is established for subsequent electrolytic plating, during which a thicker copper layer is deposited on the substrate and the walls of the through-hole vias. Areas where interconnects are to be formed are covered with dry film resist (DFR). Unwanted copper is etched away using a suitable etchant in a subtractive process, leaving behind traces that connect pads to one another. This core patterning step in the manufacturing of substrates typically utilizes a wet etch process, which comprises an impinging liquid spray of a copper etchant through a pressurized nozzle orifice onto predefined exposed copper regions bounded by the DFR defined by a photolithographic step. The etchant etches through three layers with different thicknesses the copper foil, the electroless copper and electrolytic copper. The etchant acts differently on each of these layers, resulting in a non-uniform shape that resembles a tent when viewed in a cross section with a wide base and a narrower top. Hence this process is also known as tenting. In such traditional subtractive processes, achieving features with finer features is difficult.

Traditionally, the field has focused on etching solutions based on either acidic etching (cupric chloride In hydrochloric acid) or alkaline etching (cupric chloride, with copper complexed with ammonia) for which, under conventional spray conditions, the etching process tends to be isotropic. Isotropic etching presents a fundamental limitation in the etch resolution capability as the etch depth is equal to the etch undercut for a perfectly isotropic case. On the other hand, preferential downward (anisotropic) etching can achieve smaller space resolution than isotropic etching and can accommodate tighter core patterning design rules. Preferential downward etching is possible utilizing conventional technologies by implementing hydrodynamic conditions which promote non-uniform stirring along the surface resulting in non-uniform etching. This is achieved through judicious control of convective transport processes by tuning DFR thickness and space aspect ratio, process dwell time, spray characteristics of the liquid etchant, and chemical bath conditions such as chemical concentrations, bath temperature, etc., which under certain conditions create directionality to the etching process. This approach, however, is limited in accuracy and other desired characteristics, and alternative approaches need to be explored to improve etch resolution capability and meet upcoming design rules. Thus, novel technologies that drive improvements in the subtractive etch resolution capability are desirable to enable manufacturing for future technology nodes.

Accordingly, embodiments described herein-enable a microelectronic assembly comprising a package substrate having a core, and conductive traces and buildup layers on either side of the core; and an IC die coupled to one of the one or more buildup layers of the package substrate. The conductive traces comprise at least a first metal and a second metal in a non-uniform distribution across a thickness of the conductive traces, a relative concentration of the first metal to the second metal is greater proximate to the core, and the relative concentration of the first metal to the second metal decreases with increasing distance from the core.

Embodiments of the present disclosure also provide a package substrate comprising: a core comprising insulative material; first conductive traces in contact with a surface of the core; and buildup layers in contact with the first conductive traces and the surface of the core, the buildup layers comprising second conductive traces in an organic dielectric material. The first conductive traces comprise at least a first metal and a second metal, the first conductive traces comprise a first region proximate to and in contact with the core and a second region distant from the core, parallel and opposite to the first region, a relative concentration of the first metal to the second metal is higher in the first region than in the second region, and the relative concentration of the first metal to the second metal between the first region and the second region varies non-uniformly.

Embodiments also include a method comprising: providing a core of a package substrate, the core comprising a layer of conductive material over a substrate material, the layer having a thickness, the conductive material comprising at least a first metal and a second metal distributed non-uniformly with a relative concentration of the first metal to the second metal being greater proximate to the substrate material than distant from the substrate material; attaching a mask over the layer of conductive material, the mask comprising a pattern of conductive traces; and etching the layer of conductive material with an etchant, the etchant being selective to the first metal over the second metal such that the conductive material is removed according to the pattern of the mask and a lateral distance between two adjacent conductive traces is approximately less than twice the thickness of the layer.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group ill-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/ compute circuitry (e.g., ICs implementing one or more of I/O functions, arithmetic operations, pipelining of data, etc.).

In another example, the terms “package” and “IC package” are synonymous, as are the terms “die” and “IC die.” Note that the terms “chip,” “die,” and “IC die” are used interchangeably herein.

The term “optical structure” includes arrangements of forms fabricated in ICs to receive, transform and/or transmit optical signals as described herein. It may include optical conductors such as waveguides, electromagnetic radiation sources such as lasers and light-emitting diodes (LEDs) and electro-optical devices such as photodetectors.

In various embodiments, any photonic IC (PIC) described herein may comprise a semiconductor material including, for example, N-type or P-type materials. The PIC may include, for example, a crystalline base material formed using a bulk silicon (or other bulk semiconductor material) or a 501 structure (or, in general, a semiconductor-on-insulator structure). In some embodiments, the PIC may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, the PIC may comprise a non-crystalline material, such as polymers. In some embodiments, the PIC may be formed on a printed circuit board (PCB). In some embodiments, the PIC may be inhomogeneous, including a carrier material (such as glass or silicon carbide) as a base material with a thin semiconductor layer over which is an active side comprising transistors and like components. Although a few examples of the material for the PIC are described here, any material or structure that may serve as a foundation upon which the PIC may be built falls within the spirit and scope of the present disclosure.

The term “insulating” means “electrically insulating,” the term “conducting” means “electrically conducting,” unless otherwise specified. With reference to optical signals and/or devices, components and elements that operate on or using optical signals, the term “conducting” can also mean “optically conducting.”

The terms “oxide,” “carbide,” “nitride,” etc. refer to compounds containing, respectively, oxygen, carbon, nitrogen, etc.

The term “high-k dielectric” refers to a material having a higher dielectric constant than silicon oxide, while the term “low-k dielectric” refers to a material having a lower dielectric constant than silicon oxide.

The term “insulating material” or “insulator” (also called herein as “dielectric material” or “dielectric”) refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In many embodiments, an FET is a four-terminal device. In silicon-on-insulator, or nanoribbon, or gate all-around (GAA) FET, the FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred toas a “work function” material; provided over a portion of the channel material (the “channel portion”) between the source and the drain regions, and optionally, also includes a gate dielectric material between the gate electrode material and the channel material.

In a general sense, an “interconnect” refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term “Interconnect.” The nature of the interconnect being described is to be understood herein with reference to the signal medium associated therewith. Thus, when used with reference to an electronic device, such as an IC that operates using electrical signals, the term “interconnect” describes any element formed of an electrically conductive material for providing electrical connectivity to one or more elements associated with the IC or/and between various such elements. In such cases, the term “Interconnect” may refer to both conductive traces (also sometimes referred to as “lines,” “wires,” “metal lines” or “trenches”) and conductive vias (also sometimes referred to as “vias” or “metal vias”). Sometimes, electrically conductive traces and vias may be referred to as “conductive traces” and “conductive vias”, respectively, to highlight the fact that these elements include electrically conductive materials such as metals. Likewise, when used with reference to a device that operates on optical signals as well, such as a photonic IC (PIC), “Interconnect” may also describe any element formed of a material that is optically conductive for providing optical connectivity to one or more elements associated with the PCI. In such cases, the term “interconnect” may refer to optical waveguides, including optical fiber, optical splitters, optical combiners, optical couplers, and optical vias.

The term “waveguide” refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and PCBs such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substate, the term "interconnect" may also refer to, respectively, die-to-die (DTD) Interconnects and die-to-package substrate (DTPS) Interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other In the region of compression.

The DTD interconnects disclosed herein may take any suitable form. In some embodiments, some or all of the DID interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed In a dielectric. In some embodiments, a metal-to-metal interconnect (e.g., a copper-to-copper Interconnect) may include a noble metal (e.g., gold) or a metal whose oxides are conductive (e.g., silver).

In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD Interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, Indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond-pads, landing pads, metallization, etc. present in the assembly that are not shown In the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112*a*-112*e*), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

FIG. 1 is a schematic cross-sectional view of an example microelectronic assembly 100 according to some embodiments of the present disclosure. Microelectronic assembly 100 comprises a package substrate 102 having a core 104 of insulative material. In some embodiments, the insulative material of core 104 comprises fiber-reinforced epoxy. In other embodiments, the insulative material of core 104 comprises an inorganic material, such as glass, or ceramic. Any suitable insulative material may be used in core 104 without departing from the scope of the present disclosure. Core 104 has a side (e.g., surface) 106 and an opposing side 108. Conductive traces 110 and buildup layers 111 are on either side 106, 108 of core 104. In some embodiments, a buffer layer of buildup film material (e.g., ABF) may be present between core 104 and conductive traces 110. In some embodiments, conductive traces 110 and buildup layers 111 may be present only on one side 106 or 108 of core 104. Buildup layers 111 may contact conductive traces 110 and sides 106, 108 of core 104.

Buildup layers 111 comprise an organic dielectric material 112 and layers of conductive traces 114 therein, with conductive vias (not labeled so as not to clutter the drawings) providing conductive coupling between conductive traces 114 in different layers. In various embodiment, organic dielectric material 112 comprises polyimide. In other embodiments, organic dielectric material 112 may comprise epoxy. In some embodiments, organic dielectric material 112 comprises buildup film. In yet other embodiments, organic dielectric material 112 may comprise the same material as core 104. Any suitable organic dielectric material used in package substrates as listed in the previous subsection may be used in buildup layers 111 within the broad scope of embodiments herein. In some embodiments, through-hole vias (THVs) 116 may be present in core 104, providing conductive coupling between conductive traces 114 on either side of core 104. In some embodiments, solder resist 118 may be disposed on surfaces of buildup layers 111 to which may be coupled one or more IC dies 120. In some embodiments, package substrate 102 may be coupled to a motherboard (not shown) on a side of package substrate 102 opposite to IC dies 120.

In various embodiments, conductive traces 110 in contact with core 104 comprise at least a first metal such as copper, and a second metal such as gold, titanium, nickel, etc. In a non-uniform distribution across a thickness of conductive traces 110. For example, a relative concentration of the first metal to the second metal is greater proximate to core 104, decreasing with increasing distance from core 104. In various embodiments, the second metal is relatively inert (or more inert than the first metal) to an etchant used in the manufacturing of package substrate 102 to pattern and form conductive traces 110. A non-uniform gradient in relative concentrations of the first metal to the second metal in such embodiments can enable anisotropic etching such that lateral distances between adjacent ones of conductive traces 110 may be less than twice the thickness of conductive traces 110, permitting an aspect ratio of less than 2:1, for example, 1:1 or 1.5:1. In some embodiments, conductive traces 114, including any bond-pads in buildup layers 111 may also comprise a mix of more than one metal, for example, the first metal and the second metal with relative concentrations distributed non-uniformly similar to that of conductive traces 110, with higher relative concentrations of the first metal to the second metal proximate to core 104 than distant from core 104. The non-uniform distribution of relative concentration of the first metal to second metal may be more clearly explained with a portion 200 in subsequent figures.

Figure 2:
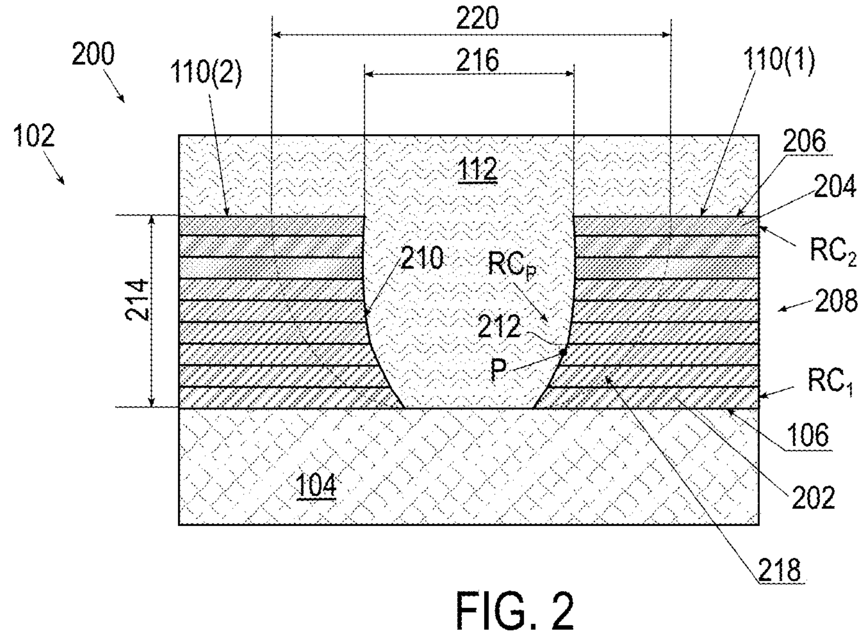
FIG. 2 is schematic cross-sectional view of a portion of the microelectronic assembly of FIG. 1.

FIG. 2 shows a simplified cross-sectional view of a portion 200 of package substrate 102, including portions of two adjacent conductive traces 110(1) and 110(2). Conductive traces 110(1) and 110(2) comprise a first region 202 proximate to core 104 and a second region 204 distant from the core. Organic dielectric material 112 of buildup layers 111 contacts a "top" surface 206 of conductive trace 110 according to the orientation shown in the figure. Top surface 206 of conductive trace 110 is parallel to and distant from core 104. A relative concentration 208 of the first metal to the second metal in first region 202 is $RC_2$; the relative concentration of the first metal to the second metal In first region 202 is $RC_2$. $RC_1$ is greater than $RC_2$ In various embodiments. Between first region 202 and second region 204, relative concentration 208 varies according to a gradient, which may be linear in some embodiments, and non-linear in other embodiments. In various embodiments, different desired gradients of relative concentration 208 may be obtained by electrolytically deposited bimetallic films that are co-deposited by judicious selection of voltage profiles. In some other embodiments, pulse deposition techniques may be used for rapid deposition of alternating nickel rich and copper rich layers, for example, in embodiments where the first metal is copper and the second metal is nickel. In yet other embodiments, physical vapor deposition (PVD) or sputter deposition may be used for depositing a non-gradient bimetallic film using an alloy target. This method may use any of the following metals in addition to copper: palladium, gold, aluminum, silver, chromium, titanium, indium, manganese, zinc, vanadium, magnesium and/or tin.

In one example, $RC_1$ may be approximately 100% of the first metal to approximately 0% of the second metal in first region 202, and $RC_2$ may be approximately 5% of the first metal to approximately 95% of the second metal in second region 204. Thus, relative concentration 208 decreases with increasing distance away from core 104. In the figure, for ease of explanation, conductive trace 110 is shown as comprising a plurality of regions of varying relative concentrations 208, each region being demarcated from others by lines and shading density suggesting a change in relative concentration 208. Such is merely for ease of explanation and is not intended to be a limitation. In an actual physical embodiment, the gradation of relative concentration 208 will not be as clearly marked, and regions of differing relative concentration 208 may not be as easily visually differentiated.

Such non-uniform distribution of relative concentration 208 results in a sidewall 210 of conductive traces 110, sidewall 210 having a non-vertical profile that varies according to relative concentration 208 or gradient thereof. Sidewall 210 is not parallel to side 106 of core 104 or top surface 206 of conductive trace 110. Sidewall 210 has a side proximate to and in contact with core 104 and an opposing side proximate to and in contact with top surface 206. At any point P on sidewall 210, the profile or slope 212 of sidewall 210 varies according to relative concentration 208, for example, RC, in the neighborhood of the point P. With such distribution of relative concentration 208, sidewall 210 is steeper in second region 204 than in first region 202 according to relative concentrations $RC_2$ and RC, respectively.

In various embodiments, such non-uniform distribution of relative concentration 208 can enable a thickness 214 of conductive traces 110 (which is also the orthogonal distance of top surface 206 from side 106 of core 104) to be approximately same as a lateral distance (e.g., space) 216 between adjacent conductive traces 110(1) and 110(2). In various embodiments, lateral distance 216 between adjacent conductive traces 110(1) and 110(2), which is approximately same as thickness 214, may be between 5 micrometers and 150 micrometers.

In contrast, surface 218 of conductive trace 110 having a uniform distribution of the first metal and the second metal, or comprising only the first metal (i.e., the second metal is absent) is approximately circular, such that the distance 220 between adjacent conductive traces 110(1) and 110(2) is at least twice the thickness 214 of conductive traces 110. Such an approximately circular shape is a result of isometric etching during package substrate manufacturing; in contrast, in embodiments of package substrate 102 as described herein, sidewall 210 that is steeper distant from core 104 than proximate to core 104, is a result of controlled anisotropic etching. The approximately circular shape represents an extreme among the various possibilities of relative concentration 208 in different embodiments (i.e., in no embodiment does top surface 206 of conductive traces 110 take on an approximately circular shape as surface 218). Thus, in various embodiments, lateral distance 216 between adjacent conductive traces 110(1) and 110(2) is not greater than twice the value of thickness 214.

During package substrate manufacturing, the etchant used to fabricate conductive traces 110 according to desired circuit patterns may be an acid or an alkali. In either case, the choice of the second metal used in conductive trace 110 may be determined based on the selectivity of the to the first metal over the second metal. In various embodiments, the etchant may have a selective affinity for the first metal over the second metal. In some embodiments, the second metal may even be inert to etching by the etchant. In other words, the etch rate of the first metal with the etchant is greater than of the second metal with the etchant. In various embodiments, the first metal is copper.

In embodiments where the etchant is an alkali, examples of the second metal include nickel, iron, bismuth, lead and tin. In embodiments where the etchant is an acid, examples of the second metal include gold and titanium. In some embodiments where the etchant is an acid, nickel may also be used, in concentrations that can permit a desired ratio of lateral distance 216 to thickness 214. In some embodiments, the etchant may be cupric chloride or ferric chloride.

Figures 3, 4A:
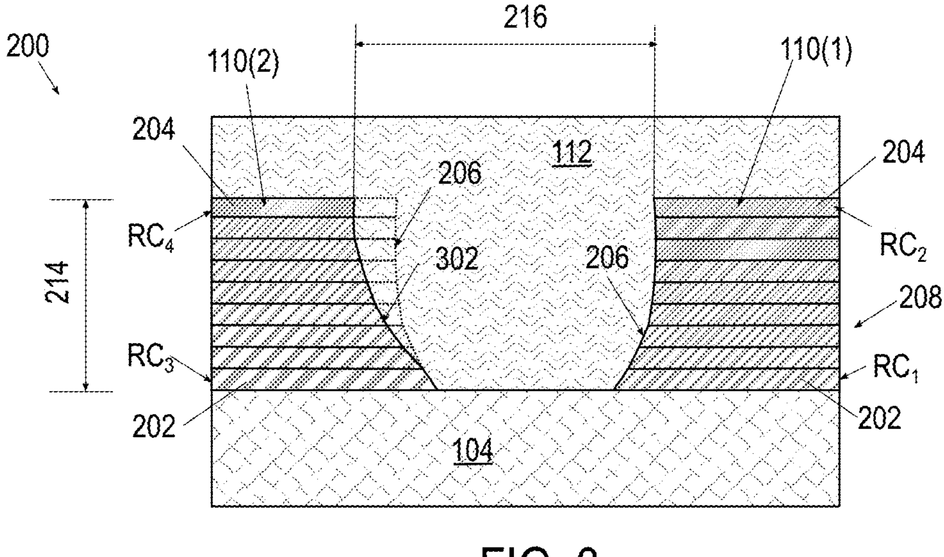
FIG. 3 is a schematic cross-sectional view of a portion of another example microelectronic assembly according to some embodiments of the present disclosure.
FIGS. 4A-4C are schematic cross-sectional views showing various stages of manufacture of an example microelectronic assembly according to some embodiments of the present disclosure.

FIG. 3 is a simplified cross-sectional view of a portion 200 of package substrate 102, including portions of two adjacent conductive traces 110(1) and 110(2). In the example embodiment shown in the figure, conductive trace 110(2) has a different distribution of relative concentration 208 as compared to conductive trace 110(1). For example, relative concentration 208 of the first metal to the second metal varies between $RC_1$ In first region 202 and $RC_2$ In second region 204 in conductive trace 110(1); relative concentration 208 of the first metal to the second metal varies between $RC_3$ in first region 202 and $RC_4$ in second region 204 in conductive trace 110(2), none of the values of relative concentration 208 being equal to each other. Because the distribution of relative concentration 208 is different in conductive trace 110(1) than in conductive trace 110(2), shape (or profile) of sidewall 302 of conductive trace 110(2) is different from the corresponding shape or profile of top surface 206 of conductive trace 110(1), the difference in profiles (or shapes) at any point along respective surfaces 206 and 302 having a direct correspondence with the difference in relative concentration 208 between the two respective points. As a result, in some embodiments, lateral distance 216 may be greater than thickness 214 (but less than twice the value of thickness 214).

In various embodiments, any of the features discussed with reference to any of FIGS. 1-3 herein may be combined with any other features to form a package with one or more IC dies as described herein. For example, in some microelectronic assemblies, some conductive traces 110 may have one distribution of relative concentration 208 of the first metal to the second metal; and other conductive traces 110 may have a different distribution of relative concentration 208 of the first metal to the second metal. Some such combinations are described above, but, in various embodiments, further combinations and modifications are possible. Various different embodiments described in different figures may be combined suitably based on particular needs within the broad scope of the embodiments.

Figure 4B:
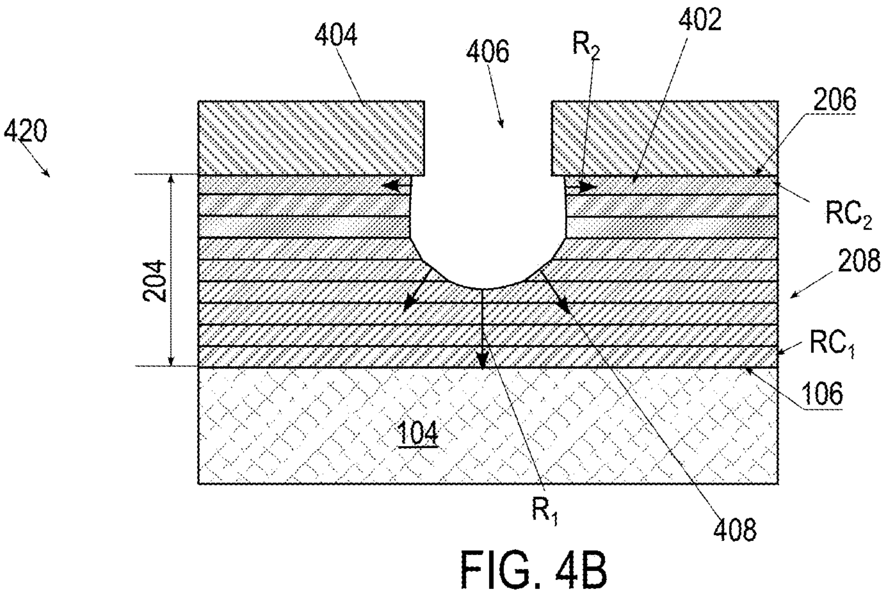
Figure 4C:
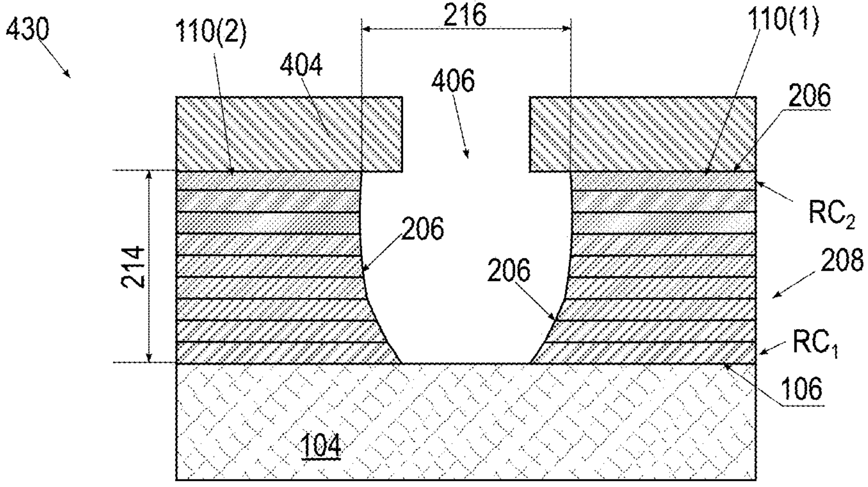

FIGS. 4A-4C are schematic cross-sectional views of various stages of manufacture of portions of package substrate 102 in microelectronic assembly 100 according to some embodiments of the present disclosure. FIG. 4A shows a portion of core 104 and a conductive layer 402 over core 104. Core 104 may be substantially similar to core 104 described in reference to previous figures. In an embodiment, conductive layer 402 may be a blanket layer of at least the first metal and the second metal, disposed over surface 106 of core 104. For example, the conductive material may be deposited with a plating process (e.g., electroplating or electroless plating) or any other suitable deposition process in sequential processes such that relative concentration 208 of the first metal to the second metal decreases in a non-uniform manner from surface 106 to surface 206.

A resist layer 404 may be disposed over conductive layer 402. In various embodiments, resist layer 404 may be any suitable resist material used in conjunction with lithographic patterning. In some embodiments, where an acidic etchant is used, resist layer 404 may comprise an organic DFR. In some such embodiments, the acidic etching chemistry may include one or more of ammoniacal or ammonium chloride, ferric chloride, cupric chloride, sodium persulfate, ammonium persulfate, ammonium hydroxide, and all other ammoniacal halides. In other embodiments, resist layer 404 comprises a metallic material, such as nickel, lead, tin, titanium, gold, iron, cobalt, manganese, chromium, or other metallic materials that have an etch selectivity relative to conductive layer 402 in an alkaline etch chemistry. In some such embodiments, the etchant may comprise ammoniacal chloride. In such embodiments where resist layer 404 comprises metallic materials, resist layer 404 may be deposited using electroplating, sputtering, chemical vapor deposition (CVD), or other known processes.

Resist layer 404 may be patterned with a lithographic patterning operation to generate circuit trace patterns for conductive traces 110. For example, a photoresist (not shown) may be deposited over resist layer 404, patterned, and used to transfer the pattern into resist layer 404. In other embodiments, resist layer 404 may be a photoimageable dielectric and the photoresist may be omitted. According to the pattern, a gap 406, representing a space between adjacent conductive traces 110 may be present in resist layer 404 in the portion shown in the figure. That is, openings 406 in resist layer 404 may be located above the positions where gaps are desired.

FIG. 48 shows a simplified cross-sectional view of a portion 410 of package substrate 102 during an etching stage. The etchant (not shown) selectively etches the first metal faster than the second metal in various embodiments. Because relative concentration 208 of the first metal is lesser proximate to surface 206 than to surface 106, an etching rate 408 is slower proximate to surface 206. Etching rate 408 increases with increasing depth toward surface 106 of core 104. Thus, for example, etching rate $R_1$ proximate to surface 106 is greater than etching rate $R_2$ proximate to surface 206. As a result, less material is removed proximate to surface 206 than farther down, closer to core 104. Further, increased etching rate 408 reduces lateral etching, causing the sidewalls to be steeper than with slower etching rates.

FIG. 4C shows a simplified cross-sectional view of a portion 420 of package substrate 102 subsequent to the etching stage. After etching is completed, conductive traces 110(1) and 110(2) are conductively separated from each other, with lateral spacing 216 approximately equal to thickness 214 due to the anisotropic etching produced by the non-uniform distribution of relative concentration 208 of the first metal to the second metal. Although profiles of sidewalls 206 of conductive traces 110(1) and 110(2) are generated according to etching rate 408, etchant chemistry, selective etching of the first metal over the second metal, geometrical and other characteristics beyond the scope of the present disclosure, the profiles may be suitably controlled (to a certain extent) by appropriate regulation of relative concentration 208 in conductive traces 110.

Figure 5:
FIG. 5 is a simplified flow diagram showing various manufacturing operations of an example microelectronic assembly according to some embodiments of the present disclosure
Figure 5:
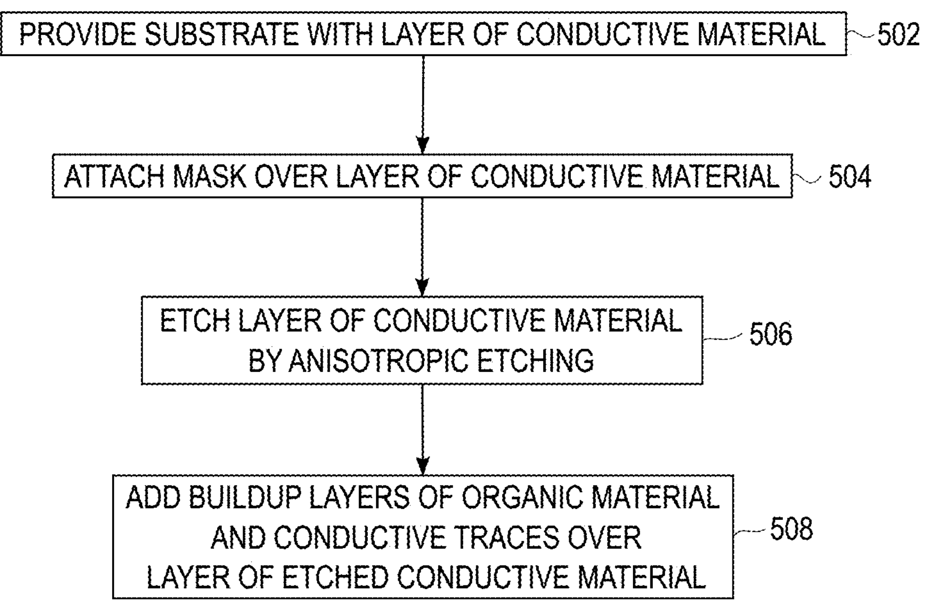

FIG. 5 is a simplified flow diagram illustrating various operations 500 that may be associated with an embodiment of microelectronic assembly 100. At 502, a substrate may be provided.

The substrate In some embodiments may comprise core 104. The substrate may be provided with a layer of conductive material, which includes conductive layer 402. At 504, a mask, comprising resist layer 404, may be attached over the layer of conductive material, including conductive layer 402. In some embodiments, the mask includes patterned DFR over resist layer 404, which may then be patterned to transfer the pattern to resist layer 404. At 506, the layer of conductive material, including conductive layer 402 may be etched by anisotropic etching. The process may be substantially similar to that described in reference to FIGS. 4A-4C. At 508, buildup layers 111 may be generated by sequentially depositing organic dielectric material 112 and conductive material, patterning conductive traces 114 suitably, and repeating until a desired stack up of buildup layers 111 is obtained.

Although FIGS. 4 and 5 illustrate various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIG. 4 may be modified in accordance with the present disclosure to fabricate others of microelectronic assembly 100 disclosed herein. Although various operations are illustrated in FIG. 4 once each, the operations may be repeated as often as desired. For example, one or more operations may be performed in parallel to manufacture and test multiple microelectronic assemblies substantially simultaneously. In another example, the operations may be performed in a different order to reflect the structure of a particular microelectronic assembly in which one or more substrates or other components as described herein may be included.

Furthermore, the operations illustrated in FIGS. 4 and 5 may be combined or may include more details than described. For example, the operations may be modified suitably without departing from the scope of the disclosure for package substrates that do not have a core of organic material, but rather, are fabricated with other materials, such as glass or ceramic materials. Still further, the various operations shown and described may further include other manufacturing operations related to fabrication of other components of the microelectronic assemblies described herein, or any devices that may include the microelectronic assemblies as described herein. For example, the operations not shown in FIG. 4 may include various cleaning operations, additional surface planarization operations, operations for surface roughening, operations to include barrier and/or adhesion layers as desired, and/or operations for incorporating microelectronic assemblies as described herein in, or with, an IC component, a computing device, or any desired structure or device.

Figure 6:
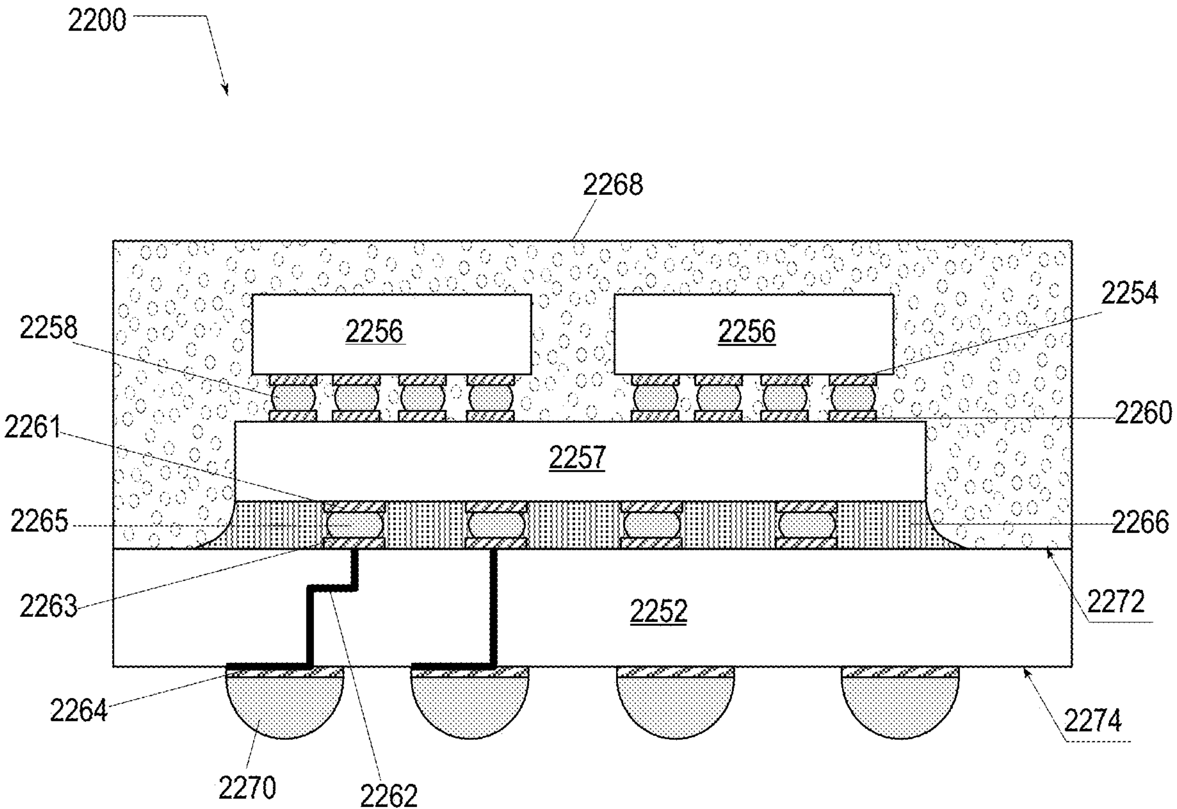
FIG. 6 is a cross-sectional view of a device package that includes one or more microelectronic assemblies in accordance with any of the embodiments disclosed herein.
Figure 7:
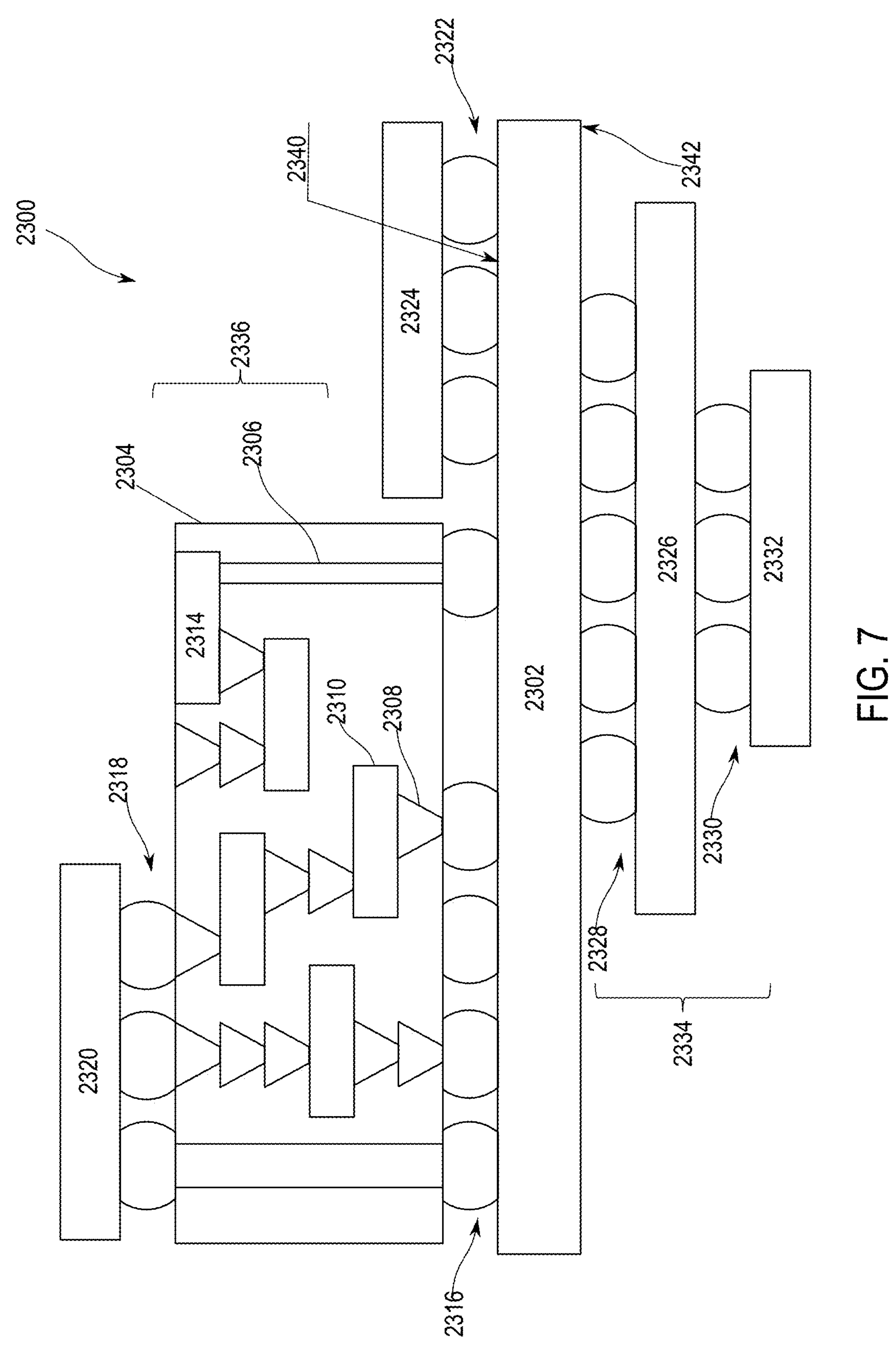
FIG. 7 is a cross-sectional side view of a device assembly that includes one or more microelectronic assemblies In accordance with any of the embodiments disclosed herein.
Figure 8:
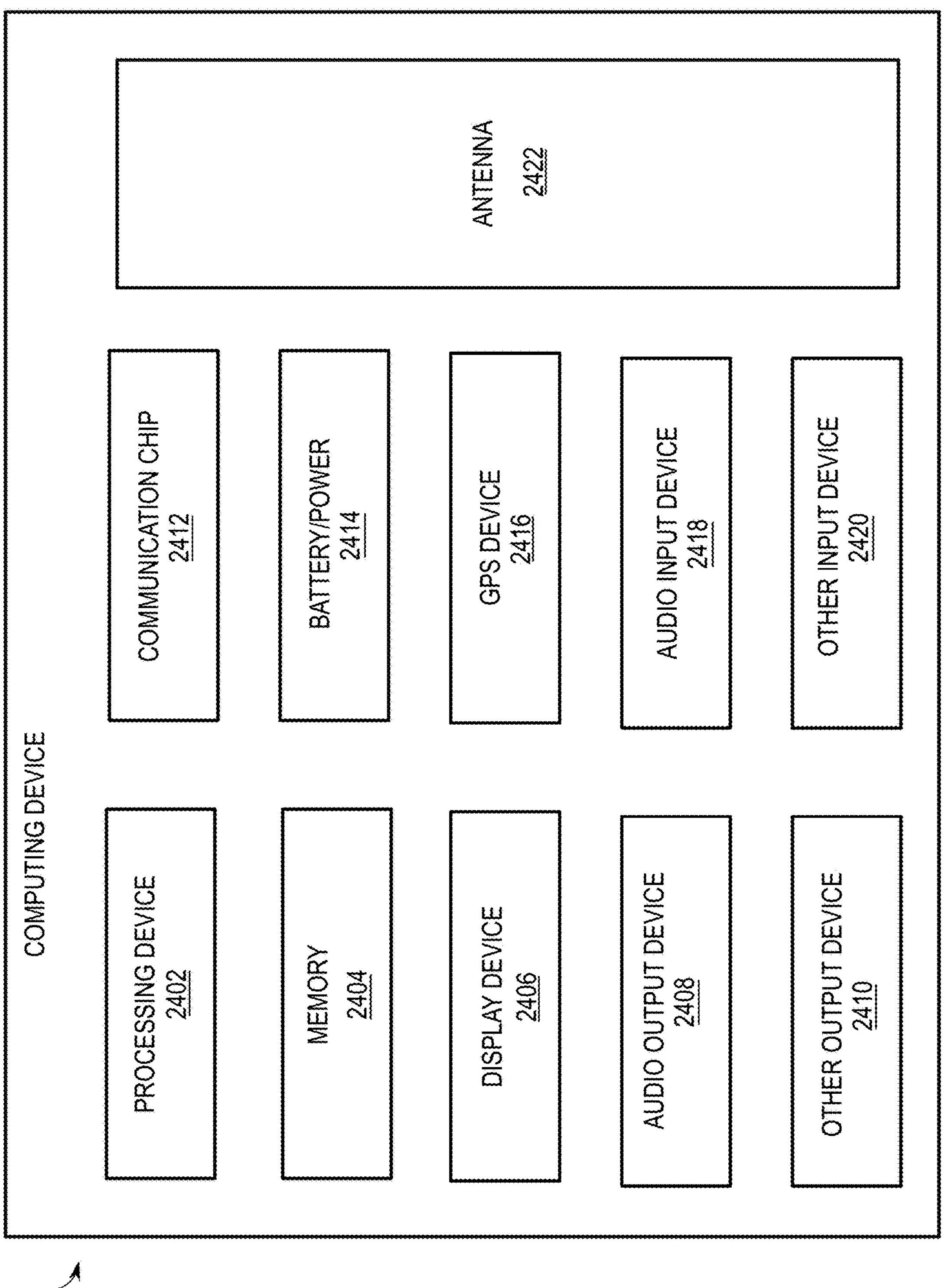
FIG. 8 is a block diagram of an example computing-device that includes one or more microelectronic assemblies in accordance with any of the embodiments disclosed herein.

The packages disclosed herein, e.g., any of the embodiments shown in FIGS. 1-5 or any further embodiments described herein, may be included in any suitable electronic component. FIGS. 6-8 illustrate various examples of packages, assemblies, and devices that may be used with or include any of the IC packages as disclosed herein.

FIG. 6 is a side, cross-sectional view of an example IC package 2200 that may include IC packages in accordance with any of the embodiments disclosed herein. In some embodiments, the IC package 2200 may be a SIP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 7.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 7 is a cross-sectional side view of an IC device assembly 2300 that may include components having one or more microelectronic assembly 100 in accordance with any of the embodiments disclosed herein, IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 ma take the form of any of the embodiments of IC package 2200 discussed above with reference to FIG. 6.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 15. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices.

More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 8 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 6). In yet another example, any one or more of the components of computing device 2400 may include an IC device assembly 2300 (e.g., as shown in FIG. 7).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SOC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WIMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Example 1 provides a package substrate (e.g., 102, FIG. 1), comprising: a core (e.g., 104) comprising insulative material; first conductive traces (e.g., 110) in contact with a surface (e.g., 106) of the core; and buildup layers (e.g., 111) in contact with the first conductive traces and the surface of the core, the buildup layers comprising second conductive traces (e.g., 114) in an organic dielectric material (e.g., 112), in which (e.g., FIG. 2): the first conductive traces comprise at least a first metal and a second metal, the first conductive traces comprise a first region (e.g., 202) proximate to and in contact with the core and a second region (e.g., 204) distant from the core, parallel and opposite to the first region, a relative concentration (e.g., 208) of the first metal to the second metal is higher in the first region than in the second region (e.g., $RC_1 > RC_2$), and the relative concentration of the first metal to the second metal between the first region and the second region varies non-uniformly.

Example 2 provides the package substrate of example 1, in which: the insulative material of the core comprises a first organic dielectric material, the organic dielectric material of the buildup layers comprises a second organic dielectric material, and the first organic dielectric material is different from the second organic dielectric material.

Example 3 provides the package substrate of example 2, in which: the first organic dielectric material is fiber-reinforced epoxy, and the second organic dielectric material is polyimide.

Example 4 provides the package substrate of example 1, in which the insulative material of the core comprises glass or ceramic.

Example 5 provides the package substrate of any one of examples 1-4, in which the relative concentration of the first metal to the second metal between the first region and the second region decreases with increasing distance from the core.

Example 6 provides the package substrate of any one of examples 1-5, in which (e.g., FIG. 2): the first conductive traces have respective surfaces (e.g., 206) distant from and parallel to the core, the respective surfaces are at an orthogonal distance (e.g., 214) from the core, a lateral distance (e.g., 216) between the surfaces of adjacent ones (e.g., 110(1), 110(2)) of the first conductive traces is approximately less than twice the orthogonal distance.

Example 7 provides the package substrate of example 6, in which the orthogonal distance between the surfaces and the core is-approximately between 5 micrometers and 150 micrometers.

Example 8 provides the package substrate of anyone of examples 6-7, in which the lateral distance is approximately same as the orthogonal distance.

Example 9 provides the package substrate of any one of examples 1-8, in which the first region comprises approximately 100% of the first metal and 0% of the second metal, and the second region comprises approximately 5% of the first metal and 95% of the second metal.

Example 10 provides the package substrate of any one of examples 1-9, in which: any one of the first conductive traces has: a top surface (e.g., 206) distant from and parallel to the core; and sidewalls (e.g., 210) not parallel to or coplanar with the top surface, the top surface is an interface between the second region and the buildup layers, the sidewalls are between the core and the top surface with the core being on one side and the top surface being on an opposite side of the respective sidewalls, and respective contours of the sidewalls vary according to the gradient of the relative concentration of the first metal to the second metal between the first region and the second region.

Example 11 provides the package substrate of any one of examples 1-10, in which: the respective contours of the sidewalls are steeper than another contour of another conductive trace comprising only the first metal.

Example 12 provides the package substrate of any one of examples 1-11, in which: respective slopes (e.g., 212) of the sidewalls measured at a point (e.g., P) along the respective contours vary according to the relative concentration (e.g., $RC_p$) of the first metal to the second metal in a neighborhood of the point.

Example 13 provides the package substrate of any one of examples 1-12, in which: the first metal has a first etch rate with an etchant, the second metal has a second etch rate with the etchant, and the first etch rate is greater than the second etch rate.

Example 14 provides the package substrate of example 13, in which the second etch rate is zero.

Example 15 provides the package substrate of example 13, in which the etchant is selective to the first metal over the second metal.

Example 16 provides the package substrate of example 13, in which: the etchant is an alkali, the first metal is copper, and the second metal comprises at least one selected from a group comprising: nickel, iron, bismuth, lead, and tin.

Example 17 provides the package substrate of example 13, in which: the etchant is an alkali, the first metal is copper, and the second metal comprises a material that is resistant to etching by the alkali.

Example 18 provides the package substrate of example 13, in which: the etchant is an acid, the first metal is copper, and the second metal comprises at least one selected from a group comprising: gold and titanium.

Example 19 provides the package substrate of example 13, in which: the etchant is an acid, the first metal is copper, and the second metal comprises a material that is resistant to etching by the acid.

Example 20 provides the package substrate of any one of examples 1-19, in which one or more of the second conductive traces comprises at least the first metal and the second metal distributed as in the first conductive traces with the relative concentration of the first metal to the second metal being higher proximate to the core than distant from the core.

Example 21 provides the package substrate of any one of examples 1-20, in which (e.g., FIG. 1): the surface of the core is a first surface, the core comprises further first conductive traces on a second surface (e.g., 108) of the core opposite to the first surface, and the package substrate further comprises additional buildup layers in contact with the additional first conductive traces and the second surface, the additional buildup layers comprising additional second conductive traces in the organic dielectric material and conductive vias through the buildup layers.

Example 22 provides a microelectronic assembly (e.g., 100, FIG. 1), comprising: a package substrate (e.g., 102) having a core (e.g., 104), and conductive traces (e.g., 110) and buildup layers (e.g., 111) on either side (e.g., 106, 108) of the core; and an IC die (e.g., 120) coupled to one of the one or more buildup layers of the package substrate, in which: the conductive traces comprise at least a first metal and a second metal in a non-uniform distribution across a thickness of the conductive traces, a relative concentration of the first metal to the second metal is greater proximate to the core, and the relative concentration of the first metal to the second metal decrease with increasing distance from the core.

Example 23 provides the microelectronic assembly of example 22, in which (e.g., FIG. 2) a space (e.g., 216) between adjacent conductive traces (e.g., 110(1), 110(2)) is approximately equal to the thickness (e.g., 214) of the conductive traces.

Example 24 provides the microelectronic assembly of example 23, in which the space between the adjacent conductive traces is approximately between 5 micrometers and 150 micrometers.

Example 25 provides the microelectronic assembly of any one of examples 22-24, in which a shape of surfaces (e.g., 210) of the conductive traces not parallel to the sides of the core varies according to the relative concentration of the first metal to the second metal.

Example 26 provides the microelectronic assembly of example 25, in which: the surfaces are steeper in a second region than in a first region, the relative concentration of the first metal to the second metal in the second region is smaller than in the first region.

Example 27 provides the microelectronic assembly of any one of examples 22-26, in which the relative concentration of the first metal to the second metal decreases from approximately 100% proximate to the core to 5% farthest from the core.

Example 28 provides the microelectronic assembly of any one of examples 22-27, in which: the first metal is copper, and the second metal comprises a selection from: nickel, gold, titanium, bismuth, lead and tin.

Example 29 provides the microelectronic assembly of any one of examples 22-28, in which an etchant has selective affinity for the first metal over the second metal such that an etch rate of the first metal with the etchant is greater than of the second metal with the etchant.

Example 30 provides the microelectronic assembly of example 29, in which the etchant is cupric chloride or ferric chloride.

Example 31 provides the microelectronic assembly of any one of examples 29-30, in which the second metal is inert to the etchant.

Example 32 provides a method, comprising: providing a core of a package substrate, the core comprising a layer of conductive material over a substrate material, the layer having a thickness, the conductive material comprising at least a first metal and a second metal distributed non-uniformly with a relative concentration of the first metal to the second metal being greater proximate to the substrate material than distant from the substrate material; attaching a mask (e.g., 404) over the layer of conductive material, the mask comprising a pattern of conductive traces; and etching the layer of conductive material with an etchant, the etchant being selective to the first metal over the second metal such that the conductive material is removed according to the pattern of the mask and a lateral distance between two adjacent conductive traces is approximately less than twice the thickness of the layer.

Example 33 provides the method of example 32, in which an etch rate of the conductive material is progressively faster away from the mask and toward the substrate.

Example 34 provides the method of anyone of examples 32-33, in which: the first metal is not inert to the etchant, and the second metal is inert to the etchant.

Example 35 provides the method of any one of examples 32-34, in which: the etchant is an acid, and the mask comprises an organic dielectric material.

Example 36 provides the method of example 35, in which: the first metal is copper, and the second metal is at least one of gold or titanium.

Example 37 provides the method of example 35, in which the etchant is cupric chloride or ferric chloride.

Example 38 provides the method of any one of examples 32-34, in which: the etchant is an alkali, and the mask comprises a metal resistant to etching by the alkali.

Example 39 provides the method of example 38, in which: the first metal is copper, and the second metal is at least one of nickel, bismuth, lead, or tin.

Example 40 provides the method of any one of examples 32-39, in which: the relative concentration of the first metal to the second metal proximate to the substrate material is 100%, and the relative concentration of the first metal to the second metal distant from the substrate material is 5%.

Example 41 provides the method of any one of examples 32-40, in which etching the layer of conductive material comprises anisotropic etching, with an etching rate is slower proximate to the mask, and faster distant from the mask, proximate to the substrate such that the anisotropic etching has a preferential downward direction toward the substrate.

Example 42 provides the method of any one of examples 32-41, in which the substrate material comprises fiber-reinforced epoxy.

Example 43 provides the method of anyone of examples 32-41, in which the substrate material comprises glass.

Example 44 provides the method of any one of examples 32-43, further comprising adding buildup layers of organic material and conductive traces over the layer of conductive material on the substrate material.

Example 45 provides the method of example 44, in which the organic material of the buildup layers comprises polyimide or buildup film.

Example 46 provides the method of example 44, in which: the conductive traces in the buildup layers comprise the first metal and the second metal distributed non-uniformly, and a relative concentration of the first metal to the second metal in the conductive traces is greater proximate to the core than distant from the core.

Example 47 provides the method of any one of examples 44-46, further comprising adding bond-pads on the buildup layers, in which: the bond-pads comprise the first metal and the second metal distributed non-uniformly, and a relative concentration of the first metal to the second metal in the bond-pads is greater proximate to the core than distant from the core.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A package substrate, comprising:
a core comprising insulative material;
first conductive traces in contact with a surface of the core; and
buildup layers in contact with the first conductive traces and the surface of the core, the buildup layers comprising second conductive traces in an organic dielectric material,
wherein:
the first conductive traces comprise at least a first metal and a second metal,
the first conductive traces comprise a first region proximate to and in contact with the core and a second region distant from the core, parallel and opposite to the first region,
a relative concentration of the first metal to the second metal is higher in the first region than in the second region, and
the relative concentration of the first metal to the second metal between the first region and the second region varies non-uniformly.

2. The package substrate of claim 1, wherein the relative concentration of the first metal to the second metal between the first region and the second region decreases with increasing distance from the core.

3. The package substrate of claim 1, wherein:
the first conductive traces have respective surfaces distant from and parallel to the core,
the respective surfaces are at an orthogonal distance from the core, and
a lateral distance between the surfaces of adjacent ones of the first conductive traces is approximately less than twice the orthogonal distance.

4. The package substrate of claim 1, wherein the first region comprises approximately 100% of the first metal and 0% of the second metal, and the second region comprises approximately 5% of the first metal and 95% of the second metal.

5. The package substrate of claim 1, wherein:
any one of the first conductive traces has:
a top surface distant from and parallel to the core; and
sidewalls not parallel to or coplanar with the top surface,
the top surface is an interface between the second region and the buildup layers,
the sidewalls are between the core and the top surface with the core being on one side and the top surface being on an opposite side of the respective sidewalls, and
respective contours of the sidewalls vary according to a gradient of the relative concentration of the first metal to the second metal between the first region and the second region.

6. The package substrate of claim 1, wherein:
the first metal has a first etch rate with an etchant,
the second metal has a second etch rate with the etchant, and
the first etch rate is greater than the second etch rate.

7. The package substrate of claim 6, wherein:
the etchant is an alkali,
the first metal is copper, and
the second metal comprises at least one selected from a group comprising: nickel, iron, bismuth, lead, and tin.

8. The package substrate of claim 6, wherein:
the etchant is an acid,
the first metal is copper, and
the second metal comprises a material that is resistant to etching by the acid.

9. A microelectronic assembly, comprising:
a package substrate having a core, and conductive traces and buildup layers on either side of the core; and
an integrated circuit (IC) die coupled to one of the buildup layers of the package substrate,
wherein:
the conductive traces comprise at least a first metal and a second metal in a non-uniform distribution across a thickness of the conductive traces,
a relative concentration of the first metal to the second metal is greater proximate to the core, and
the relative concentration of the first metal to the second metal decreases with increasing distance from the core.

10. The microelectronic assembly of claim 9, wherein a space between adjacent conductive traces is approximately equal to the thickness of the conductive traces.

11. The microelectronic assembly of claim 9, wherein a shape of surfaces of the conductive traces not parallel to the sides of the core varies according to the relative concentration of the first metal to the second metal.

12. The microelectronic assembly of claim 11, wherein:
the surfaces are steeper in a second region than in a first region, and
the relative concentration of the first metal to the second metal in the second region is smaller than in the first region.

13. The microelectronic assembly of claim 9, wherein:
the first metal is copper, and
the second metal comprises a selection from: nickel, gold, titanium, bismuth, lead and tin.

14. The microelectronic assembly of claim 9, wherein an etchant has selective affinity for the first metal over the second metal such that an etch rate of the first metal with the etchant is greater than of the second metal with the etchant.

15. The microelectronic assembly of claim 14, wherein the second metal is inert to the etchant.

16. A method, comprising:
providing a core of a package substrate, the core comprising a layer of conductive material over a substrate material, the layer having a thickness, the conductive material comprising at least a first metal and a second metal distributed non-uniformly with a relative concentration of the first metal to the second metal being greater proximate to the substrate material than distant from the substrate material;

attaching a mask over the layer of conductive material, the mask comprising a pattern of conductive traces; and etching the layer of conductive material with an etchant, the etchant being selective to the first metal over the second metal such that the conductive material is removed according to the pattern of the mask and a lateral distance between two adjacent conductive traces is approximately less than twice the thickness of the layer.

17. The method of claim 16, wherein:

the first metal is not inert to the etchant, and the second metal is inert to the etchant.

18. The method of claim 16, wherein:

the etchant is an acid, and the mask comprises an organic dielectric material.

19. The method of claim 16, wherein:

the etchant is an alkali, and the mask comprises a metal resistant to etching by the alkali.

20. The method of claim 16, wherein etching the layer of conductive material comprises anisotropic etching, with an etching rate is slower proximate to the mask, and faster distant from the mask, proximate to the substrate material such that the anisotropic etching has a preferential downward direction toward the substrate material.

* * * * *